US012730387B2

(12) United States Patent
Hwang et al.

(10) Patent No.: US 12,730,387 B2
(45) Date of Patent: Sep. 8, 2026

(54) SUBSTRATE PROCESSING APPARATUS FOR PROCESSING A SUBSTRATE IN ONE PROCESS CHAMBER

(71) Applicant: SAMSUNG ELECTRONICS CO., LTD., Suwon-si (KR)

(72) Inventors: Young Ho Hwang, Suwon-si (KR); Jae Hong Lim, Suwon-si (KR); Chul Min Cho, Suwon-si (KR); Sang Hyun Lim, Suwon-si (KR); Young Kyun Im, Suwon-si (KR); Seok Heo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 162 days.

(21) Appl. No.: 18/793,124

(22) Filed: Aug. 2, 2024

(65) Prior Publication Data

US 2025/0138439 A1 May 1, 2025

(30) Foreign Application Priority Data

Nov. 1, 2023 (KR) ........................ 10-2023-0148969

(51) Int. Cl.
*G03F 7/00* (2006.01)
*G03F 7/20* (2006.01)

(52) U.S. Cl.
CPC ........ *G03F 7/70875* (2013.01); *G03F 7/2041* (2013.01); *G03F 7/70725* (2013.01)

(58) Field of Classification Search
CPC ...... G03F 7/2041; G03F 7/40; G03F 7/70725; G03F 7/70875; G03F 7/3021; G03F 7/38
See application file for complete search history.

(56) References Cited

U.S. PATENT DOCUMENTS 8,445,189 B2 5/2013 Yamamoto et al.
11,430,662 B2 * 8/2022 Hidaka ............. H01J 37/32715
11,693,319 B2 * 7/2023 Tanaka .................... G03F 7/168 355/67
12,553,138 B2 * 2/2026 Lee ........................... C23F 1/00
2014/0231013 A1 * 8/2014 Hinode ................. H10P 50/283 156/345.23

(Continued)

FOREIGN PATENT DOCUMENTS

CN 106444304 A 2/2017
KR 10-2015-0048224 A 5/2015

(Continued)

*Primary Examiner* — Deoram Persaud
(74) *Attorney, Agent, or Firm* — MORGAN, LEWIS & BOCKIUS LLP

(57) ABSTRACT

A substrate processing apparatus includes a process chamber having a space in which a substrate is disposed and processed in the process chamber, a supporter disposed in the process chamber and configured to support and rotate the substrate, a heater disposed in the process chamber and configured to heat a first surface of the substrate, where the heater includes one or more irradiation modules for generating light pulses and directing the light pulses to the first surface of the substrate, a controller configured to control an intensity of the light pulse generated by each of the one or more irradiation modules of the heater, and a fluid supplier configured to supply fluid to the first surface of the substrate.

20 Claims, 16 Drawing Sheets

(56) References Cited

U.S. PATENT DOCUMENTS

2015/0072078 A1* 3/2015 Negoro ............... H10P 72/0406 427/346
2015/0227050 A1* 8/2015 Lin .......................... G03F 7/40 438/5
2016/0381732 A1* 12/2016 Möench .............. H10P 72/0436 118/641
2021/0183660 A1* 6/2021 Goh ...................... H10P 50/283
2024/0006197 A1* 1/2024 Yamada .............. H10P 72/0436
2024/0355650 A1* 10/2024 Kanakasabapathy ........................ H10P 72/0436
2025/0021025 A1* 1/2025 Hwang ............... G03F 7/70625
2025/0093276 A1* 3/2025 Hayashi ................. G01N 21/85

FOREIGN PATENT DOCUMENTS

KR 10-2023-0038019 A 3/2023
KR 10-2023-0080770 A 6/2023

* cited by examiner

SUBSTRATE PROCESSING APPARATUS FOR PROCESSING A SUBSTRATE IN ONE PROCESS CHAMBER

CROSS-REFERENCE TO RELATED APPLICATION

This U.S. nonprovisional application claims priority under 35 U.S.C. § 119 to Korean Patent Application No. 10-2023-0148969 filed on Nov. 1, 2023 in the Korean Intellectual Property Office, the disclosure of which is incorporated by reference herein in its entirety.

TECHNICAL FIELD

Embodiments of the present disclosure relates to a substrate processing apparatus, and more particularly substrate processing apparatus capable of performing a post-exposure bake (PEB) process, a developing process, and a hard bake process in one process chamber.

DISCUSSION OF RELATED ART

Among photolithography processes that are used to manufacture a semiconductor device, an exposure process is a process in which light energy is applied to a pattern filtered from a mask. At this time, photoresist, which have been reacted with the light, receives heat energy in a subsequent post-exposure bake process such that the solubility of the photoresist changes. A photoresist area where the solubility has changed is then dissolved under a reaction with a developer in a developing process, thereby forming a pattern. When manufacturing the semiconductor device through the photolithography process in the aforementioned manner, methods to set a critical dimension (CD) of the pattern formed in a semiconductor substrate to a target dimension, and lower a line edge roughness of patterns is currently being researched.

SUMMARY

Embodiments of the present disclosure provide a substrate processing apparatus in which at least some of the photolithography processes are performed at once inside a single process chamber to form a pattern with a target critical dimension and a low line edge roughness in a semiconductor substrate.

According to embodiments of the present disclosure, a substrate processing apparatus includes a process chamber having a space in which a substrate is disposed and processed in the process chamber, wherein the substrate includes a first surface and a second surface opposite from the first surface. The substrate processing apparatus further includes a supporter disposed in the process chamber and configured to support and rotate the substrate. The substrate processing apparatus further includes a heater disposed in the process chamber and configured to heat the first surface of the substrate, wherein the heater includes one or more irradiation modules for generating light pulses and directing the light pulses to the first surface of the substrate. The substrate processing apparatus further includes a controller configured to control an intensity of the light pulse generated by each of the one or more irradiation modules of the heater. The substrate processing apparatus further includes a fluid supplier configured to supply fluid to the first surface of the substrate. In some cases, a period during which the fluid supplier supplies the fluid to the first surface of the substrate includes a first time period and a second time period after the first time period. In some cases, the controller is configured to control the intensity of the light pulse generated by each of the one or more irradiation modules such that the fluid having a first temperature is supplied to the first surface of the substrate during the first time period, and the fluid having a second temperature lower than the first temperature is supplied to the first surface of the substrate during the second time period.

According to embodiments of the present disclosure, a substrate processing apparatus includes a substrate having a first surface and a second surface opposite from the first surface, wherein the first surface includes a first area and a second area surrounding the first area. The substrate processing apparatus further includes a process chamber having a space in which the substrate is disposed and processed. The substrate processing apparatus further includes a support plate having a third surface disposed under the second surface of the substrate, and a fourth surface opposite from the third surface. The substrate processing apparatus further includes a rotator connected to the fourth surface of the support plate and configured to rotate the support plate. The substrate processing apparatus further includes a first irradiation module disposed in the process chamber and configured to generate a first light pulse and direct the first light pulse to the first area of the substrate. The substrate processing apparatus further includes a second irradiation module disposed in the process chamber and configured to generate a second light pulse and irradiate the second light pulse to the second area of the substrate. The substrate processing apparatus further includes a controller configured to control an intensity of each of the first light pulse and the second light pulse generated by each of the first irradiation module and the second irradiation module, respectively. The substrate processing apparatus further includes a fluid supplier configured to supply fluid to the first surface of the substrate disposed on the support plate. In some cases, a period during which the fluid supplier supplies the fluid to the first surface of the substrate includes a first time period and a second time period after the first time period. In some cases, a sum of an intensity of the first light pulse and an intensity of the second light pulse during the first time period is greater than a sum of an intensity of the first light pulse and an intensity of the second light pulse during the second time period. In some cases, the fluid includes a developer.

According to embodiments of the present disclosure, a substrate processing apparatus includes a process chamber having a space in which a substrate is disposed and processed. The substrate processing apparatus further includes a supporter configured to support and rotate the substrate. The substrate processing apparatus further includes a heater disposed on top of the substrate and spaced apart from the substrate, wherein the heater is configured to direct a light pulse to the substrate to perform a first treatment and a second treatment on the substrate, and wherein the second treatment is different from the first treatment. The substrate processing apparatus further includes a controller configured to control an intensity of the light pulse generated by the heater. The substrate processing apparatus further includes a fluid supplier configured to supply fluid to the substrate to perform a third treatment on the substrate, wherein the third treatment is different from the first treatment and the second treatment. In some cases, the substrate processing apparatus is configured to perform the first treatment using the heater during a first time period inside the process chamber, perform the third treatment using the fluid supplier during a second time period after the first period and a third period after the second period inside the process chamber, and perform the second treatment using the heater during a fourth time period after the third period inside the process chamber. In some cases, the controller is configured to control the intensity of the light pulse generated by the heater to apply heat to the substrate at a first temperature during the first time period, apply heat to the substrate at a second temperature lower than a first temperature during the second time period apply heat to the substrate at a third temperature lower than the second temperature during the third time period, and apply heat to the substrate at a fourth temperature higher than the second temperature during the fourth time period.

DETAILED DESCRIPTION

Figure 1:
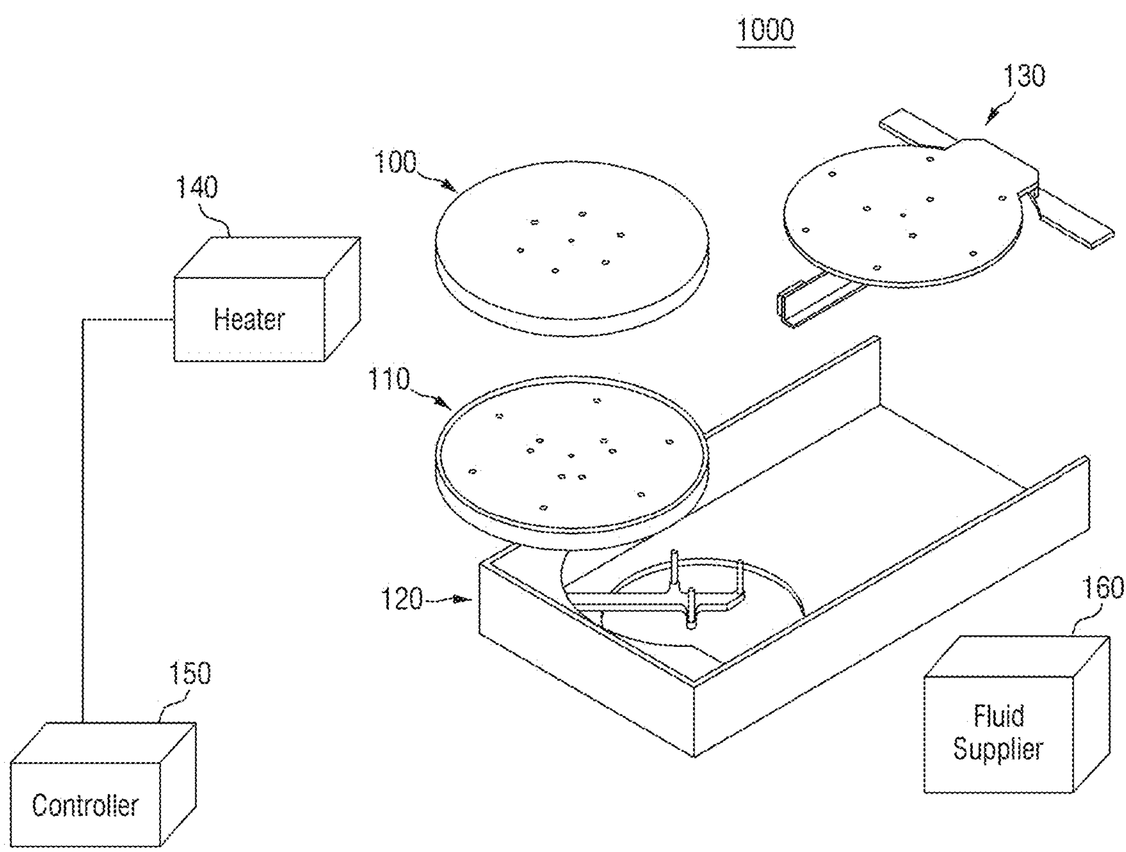
FIG. 1 is an example of a substrate processing apparatus according to some embodiments of the present inventive concept.

Hereinafter, the inventive concepts are described in more detail. For simplicity and clarity of illustration, elements in the drawings are not necessarily drawn to scale. In some cases, for example, a shape, a size, a ratio, an angle, a number, disclosed in the drawings for illustrating embodiments of the present disclosure are illustrative, and the present disclosure is not necessarily limited thereto. The same reference numbers in different drawings represent the same or similar elements, and as such perform similar functionality.

Further, descriptions and details of well-known steps and elements may be omitted for simplicity of the description. Furthermore, in the following detailed description of the present disclosure, numerous specific details are set forth in order to provide a thorough understanding of the present disclosure. However, it will be understood that the present disclosure may be practiced without these specific details. In some cases, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included in the spirit and scope of the present disclosure as defined by the claims.

The terminology used herein is for the purpose of describing particular embodiments and is not intended to limit the present disclosure. For example, the singular forms “a” and “an” are intended to include the plural forms as well (e.g., one or more), unless the context clearly indicates otherwise. It will be further understood that the terms “comprises”, “comprising”, “includes”, and “including” when used in this specification, specify the presence of the stated features, integers, operations, elements, and/or components, but do not preclude the presence or addition of one or more other features, integers, operations, elements, components, and/or portions thereof. For example, the term “and/or” includes any and all combinations of one or more of the associated listed items. Expression such as “at least one of” when preceding a list of elements may modify the entirety of list of elements and might not modify the individual elements of the list. When referring to “C to D”, this represents C inclusive to D inclusive unless otherwise specified.

It will be understood that, although the terms “first”, “second”, “third”, and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present “on”, “beneath”, or “below” a second element or layer, the first element may be disposed directly on or beneath the second element or may be disposed indirectly (e.g., spaced apart) on or beneath the second element with a third element or layer being disposed between the first and second elements or layers. It will be understood that when an element or layer is referred to as being “connected to”, or “coupled to” another element or layer, it may be directly on, connected to, or coupled to the other element or layer, or one or more intervening elements or layers may be present. In addition, it will also be understood that when an element or layer is referred to as being “between” two elements or layers, it may be the only element or layer between the two elements or layers, or one or more intervening elements or layers may also be present.

Further, when a layer, film, region, plate, or the like is disposed “on” or “on a top” of another layer, film, region, plate, or the like, the former may directly contact the latter or another layer, film, region, plate, or the like may be disposed between the former and the latter. For example, when a layer, film, region, plate, or the like is directly disposed “on” or “on a top” of another layer, film, region, plate, or the like, the former directly contacts the latter and still another layer, film, region, plate, or the like is not disposed between the former and the latter. Furthermore, for example, when a layer, film, region, plate, or the like is disposed “below” or “under” another layer, film, region, plate, or the like, the former may directly contact the latter or another layer, film, region, plate, or the like may be disposed between the former and the latter. As used herein, when a layer, film, region, plate, or the like is directly disposed “below” or “under” another layer, film, region, plate, or the like, the former directly contacts the latter and another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

For example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", or "before", another event may occur therebetween unless "directly after", "directly subsequent" or "directly before" is not indicated.

The features of the various embodiments of the present disclosure may be partially or entirely combined with each other, and may be technically associated with each other or operate with each other. The embodiments may be implemented independently of each other and may be implemented together in an association relationship.

Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings is turned upside down, elements described as "below" or "beneath" or "under" other elements or features would then be oriented "above" the other elements or features. Thus, the example terms "below" and "under" may encompass both an orientation of above and below. The device may be otherwise oriented for example, rotated 90 degrees or at other orientations, and the spatially relative descriptors used herein should be interpreted accordingly.

Hereinafter, embodiments of the present disclosure is described with reference to the accompanying drawings. Hereinafter, a substrate processing apparatus according to some embodiments of the present inventive concept is described with reference to the accompanying drawings.

FIG. 1 is an example of a substrate processing apparatus according to some embodiments of the present inventive concept. Referring to FIG. 1, a substrate processing apparatus 1000 includes a process chamber 100, a supporter 110, a heater 140, a controller 150, and a fluid supplier 160. In some embodiments, the substrate processing apparatus 1000 further includes a base module 120 and a transfer robot 130.

In some embodiments, the process chamber 100 may provide a space for processing a substrate to manufacture a semiconductor device therein. For example, the process chamber 100 may perform a post-exposure bake (PEB) process, a developing process, and/or a hard bake process on the substrate. However, the present disclosure is not necessarily limited thereto.

In some cases, for example, during the post-exposure bake process, a substrate undergoes another baking step to harden the remaining photoresist and remove remaining solvent. In some cases, for example, during the developing process, a developer solution is used to remove the exposed or exposed regions of the photoresist. As a result, the target pattern on the substrate may be revealed. In some cases, for example, during the hard bake process, a photoresist-coated substrate is heated after exposing to a light source (or light energy). The heating process removes remaining solvent from the photoresist so that the substrate is dry and ready for further processing.

In some cases, the substrate processing apparatus 1000 may be referred to as another apparatus based on a function of the process chamber 100. For example, the substrate processing apparatus 1000 may be referred to as a PEB apparatus, a developing apparatus, or a hard bake apparatus based on the process performed within the process chamber 100, such as the PEB process, the developing process, or the hard bake process, respectively.

According to an embodiment, some or all of the above processes may be performed together inside the process chamber 100. For example, the PEB process, the developing process, and the hard bake process may be sequentially performed or simultaneously performed inside the process chamber 100 without the need of transferring the substrate to another chamber. Accordingly, the substrate processing apparatus 1000 may include components for performing the PEB process, the developing process, and the hard bake process within the process chamber 100.

In some cases, the process chamber 100 may be configured to cover both the supporter 110 and the substrate. In some cases, the process chamber 100 is configured to cover the substrate. The process chamber 100 may include an opening, and the substrate may be carried into and out of the process chamber 100 through the opening.

The supporter 110 is configured to support the substrate during the various processing of the substrate inside the process chamber 100. In some embodiments, the supporter 110 may be configured to support the substrate thereon and simultaneously rotate the substrate. For example, when a process (e.g., the PEB process, the developing process, or the hard bake process) is performed, the process may be uniformly performed on a surface of the substrate as the substrate rotates.

The heater 140 may be configured to apply heat to the substrate when a process is used for heat treating the substrate. For example, as the PEB process or the hard bake process is performed on the substrate, the heater 140 may be configured to apply heat to the substrate. In some cases, the heater 140 may heat the substrate using light-based heat energy. For example, the heater 140 may generate light pulses and direct the light pulses to the surface of the substrate. Accordingly, the heater 140 may use the light pulses to heat the substrate through a radiation heat treatment method. For example, the heater 140 may generate laser pulses and direct the laser pulses on the surface of the substrate to heat the substrate. However, the present disclosure is not necessarily limited thereto.

The controller 150 may control an intensity of the light-based heat energy generated from the heater 140. In some embodiments, the heater 140 comprises a plurality of modules where each of the plurality of modules may individually generate the light-based heat energy. In some cases, the controller 150 may be configured to individually control the intensity of the light-based heat energy generated by each of the plurality of modules. For example, the controller 150 may be configured to individually control the intensity of the light pulse generated by each of the modules of the heater 140. In some case, for example, the controller 150 may be configured to jointly control the intensity of the light pulse generated by each of the models of the heater 140. In one aspect, the fluid supplier 160 may be configured to provide a developer to the substrate to perform a developing process inside the process chamber 100. In some cases, a developer is a chemical solution used to selectively remove exposed or unexposed regions of the photoresist material.

In some embodiments, the substrate processing apparatus 1000 may include a transfer robot 130 and a base module 120. The transfer robot 130 may introduce the substrate into the substrate processing apparatus 1000 or take a processed substrate out of the substrate processing apparatus 1000. For example, when the substrate is transferred by the transfer robot 130, the opening of the process chamber 100 may be opened. Subsequently, when the substrate is mounted on the supporter 110 through the transfer robot 130, the opening of the process chamber 100 may be closed. Subsequently, when the process on the substrate are completed, the opening of the process chamber 100 may be reopened, where the transfer robot 130 may retrieve the processed substrate. The base module 120 may support various components of the substrate processing apparatus 1000, such as the process chamber 100 and the supporter 110.

Accordingly, the substrate processing apparatus 1000 may include various components to perform the PEB process, the developing process, and the hard bake process on the substrate. For example, the PEB process, the developing process, and the hard bake process may be sequentially performed or simultaneously performed in the process chamber 100. Hereinafter, further detail on the substrate processing apparatus 1000 is described.

Figure 2:
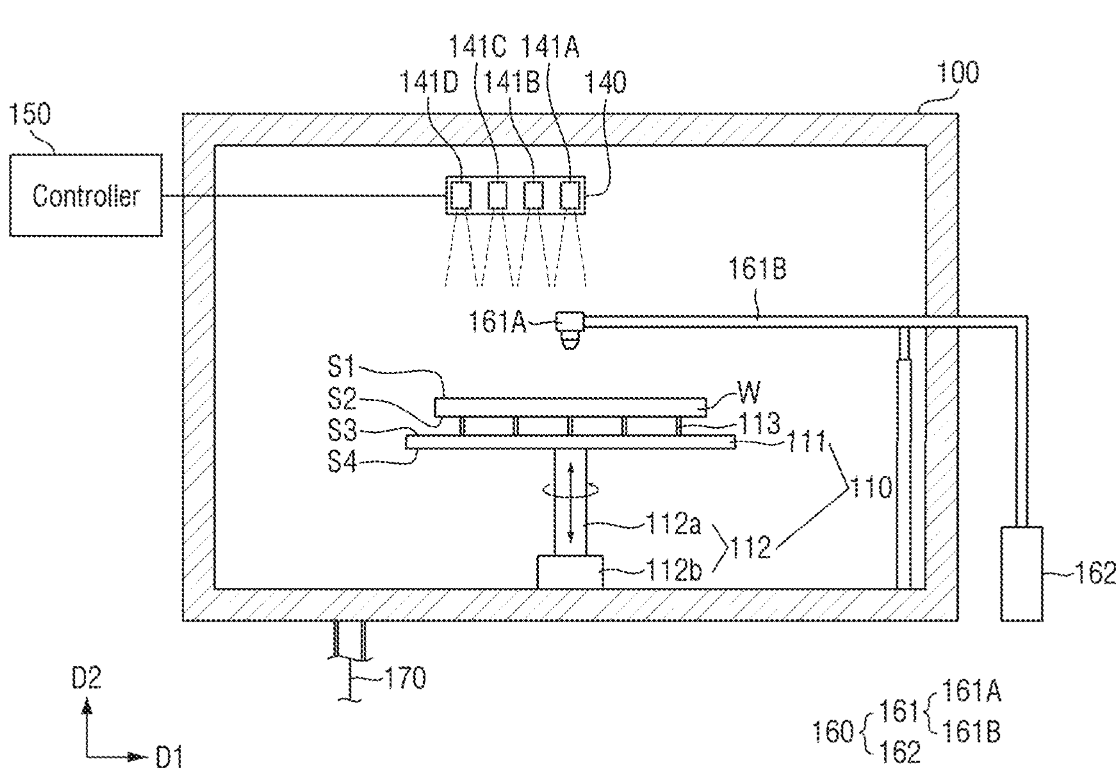
FIG. 2 is a side view of the substrate processing apparatus of FIG. 1.

FIG. 2 is a side view of the substrate processing apparatus of FIG. 1.

Referring to FIG. 2, the process chamber 100 may include a sealed space having a predetermined dimension to perform a process on the substrate W. The internal sealed space of the process chamber 100 may be in a vacuum or near-vacuum state. Furthermore, the process chamber 100 may be in various shapes and sizes based on a size of the substrate W. For example, the process chamber 100 may have a cylindrical shape corresponding to a disk-shaped substrate W. However, the shape thereof is not necessarily limited thereto. In an embodiment, the process chamber 100 may include a conductive member comprising aluminum. In some cases, the process chamber 100 may maintain an electrical ground state to prevent external noise while the process is performed in the process chamber 100.

The process chamber 100 may isolate the substrate W from an exterior environment while the process is in progress. In some cases, the process chamber 100 may prevent the heat for processing the substrate W from leaking to the exterior environment. Furthermore, the process chamber 100 may prevent the substrate W from being contaminated by particles outside of the process chamber 100.

An outlet 170 may be formed at a bottom or base of the process chamber 100. Byproducts generated inside the process chamber 100 during the process may be discharged to the outside of the process chamber 100 through the outlet 170. For example, the outlet 170 may include an exhaust structure for exhausting gas generated when a heating process is performed inside the process chamber 100. Alternatively, chemicals or fluid produced as a byproduct of the developing process may be discharged to the outside of the process chamber 100 through the outlet 170.

In some cases, the substrate W disposed inside the process chamber 100 may include the substrate W. In some cases, the substrate W may include a stack structure and a predetermined layer or film formed on the surface of the substrate W. In some cases, the surface of the substrate W may refer to an exposed surface of the substrate W. In some cases, the surface of the substrate W may refer an exposed surface of the predetermined layer or film formed on the substrate W.

For example, the substrate W may be a wafer. In some cases, the substrate W may include the wafer and at least one material film on the wafer. In some cases, the film may be a thin layer of coating comprising one type of material, such as an element or a compound. The material film may be an insulating film and/or a conductive film formed on the wafer using various schemes such as deposition, coating, and/or plating. For example, the insulating film may include an oxide film, a nitride film, or an oxynitride film, and the conductive film may include a metal film or a polysilicon film. For example, the material film may be formed in a predetermined pattern on the wafer.

The substrate W has a first surface S1 facing toward an upper region of the process chamber 100 and a second surface S2 opposite to the first surface S1 along a second direction D2. For example, the second surface S2 of the substrate W may face toward a bottom region of the process chamber 100. In some cases, the upper region and the bottom region may be defined along the second direction D2. The substrate W disposed inside the process chamber 100 may be in a state where a photolithography process is being performed thereon. In some cases, an exposure process of the photolithography process on the substrate W may be completed.

The supporter 110 may include a support plate 111 and a rotator 112. The support plate 111 may include a third surface S3 and a fourth surface S4 facing opposite from each other along the second direction D2. In some cases, the third surface S3 of the support plate 111 is facing at a same direction as the first surface S1 of the substrate W along the second direction D2. In some cases, the fourth surface S4 of the support plate 111 is facing at a same direction as the second surface S2 of the substrate W along the second direction D2. The second surface S2 of the substrate W may be disposed on the third surface S3 of the support plate 111. The support plate 111 may include a support pin 113. The support pin 113 may be disposed inside the support plate 111 before the substrate W is loaded thereon. After the substrate W has been loaded thereon, the support pin 113 may rise up towards the upper region of the process chamber 100 along the second direction D2 to support the substrate W thereon. In some cases, the support pin is disposed between the substrate W and the support plate 111. In some cases, the support pin 113 directly contacts the second surface S2 of the substrate W. The support pin 113 may support and secure the substrate W so that the substrate W does not slip away from the support plate 111 when the support plate 111 rotates. FIG. 2 shows that a width (measured in a first direction D1) of the support plate 111 is larger than a width of the substrate W. However, according to an embodiment, the width of the substrate W may be larger than the width of the support plate 111.

The rotator 112 may include a support shaft **112*a* and a driver 112*b*. The support shaft 112*a* may be disposed under the support plate 111 and may be coupled to the support plate 111. The support shaft 112*a* may be extendable along the second direction D2 and/or retractable in a direction opposite to the second direction D2 by the driver 112*b*. The support shaft 112*a* may be rotated by the driver 112*b*. For example, the driver 112*b* may include a motor. When the driver 112*b* rotates the support shaft 112*a*, the support plate 111 coupled to the support shaft 112*a* may rotate simultaneously. In some cases, the driver 112*b* may rotate the support shaft 112***a* about an axis of rotation in a same direction as the second direction D2. The substrate W loaded on the support plate 111 may be rotated together with the rotation of the support plate 111 via the support pin 113.

In some embodiments, the heater 140 may be disposed inside the process chamber 100, where the heater is disposed on top of the substrate W and may be spaced apart from the substrate W in the second direction D2. In some embodiments, the heater 140 may include a plurality of irradiation modules 141A, 141B, 141C, and 141D. FIG. 2 shows that the heater 140 includes four irradiation modules. However, the number of irradiation modules included in the heater 140 is not necessarily limited thereto. According to an embodiment, the number of irradiation modules included in the heater 140 may be smaller than four or larger than four.

Each of the irradiation modules 141A, 141B, 141C, and 141D may generate a light pulse, where the light pulse is directed to the first surface S1 of the substrate W. For example, when the light pulse generated by each of the irradiation modules 141A, 141B, 141C, and 141D is a laser pulse, the heater 140 may be include a VCSEL array (Vertical-Cavity Surface-Emitting Laser Array), and each of the irradiation modules 141A, 141B, 141C, and 141D may correspond to a laser heat module included in the laser array. However, the heater 140 is not necessarily limited thereto. For example, the heater 140 may include a radiation heat treatment unit that generates the light pulse, where the light pulse has the light-based heat energy. For example, each of the irradiation modules 141A, 141B, 141C, and 141D may be a tungsten halogen lamp or a flash lamp that generates the light pulse, and the heater 140 may include a set of the tungsten halogen lamps or a set of the flash lamps.

Each of the irradiation modules 141A, 141B, 141C, and 141D may direct light pulse to a corresponding region of the first surface S1 of the substrate W. For example, the irradiation module 141A may direct the light pulse to a central region of the substrate W, and the irradiation module 141D may direct the light pulse to an edge region of the substrate W. Accordingly, when the substrate processing apparatus 1000 performs a process on the substrate W, each of the irradiation module 141A, 141B, 141C, and 141D of the heater 140 may selectively heat a local region of the substrate W such that a profile of a pattern formed in the substrate W may be selectively controlled. Further detail on pattern forming is described with reference to FIG. 13.

In some embodiments, the controller 150 may control the intensity of the light pulse generated by each of the irradiation modules 141A, 141B, 141C, and 141D of the heater 140. For example, the controller 150 may individually control a power of each of the irradiation modules 141A, 141B, 141C, and 141D to turn on the power for one or more of the irradiation modules 141A, 141B, 141C, and 141D included in the heater 140 and to turn off the power for the remaining irradiation modules. Furthermore, the controller 150 may individually control the intensity of the light pulse generated by each of the irradiation modules that are turned on.

Thus, the controller 150 may control the temperature inside the process chamber 100 when each of the PEB process, the developing process, and the hard bake process is performed inside the process chamber 100. For example, when the developing process is performed on the substrate W, the temperature of the developer may be adjusted as needed. In some cases, the controller 150 is disposed outside of the process chamber 100, where the controller 150 is electrically connected to the heater 140 to control the plurality of irradiation modules 141A, 141B, 141C, and 141D of the heater.

The fluid supplier 160 may include a fluid sprayer 161 and a fluid supply 162. The fluid sprayer 161 may include a fluid spraying nozzle 161A and a fluid supply pipe 161B. The fluid spraying nozzle 161A may be disposed inside the process chamber 100. In some cases, the fluid spraying nozzle 161A may be disposed on the substrate W. For example, the fluid spraying nozzle 161A may be disposed above the first surface S1 of the substrate W. Fluid may be sprayed toward the first surface S1 of the substrate W through the fluid spraying nozzle 161A. The fluid supply pipe 161B may connect the fluid supply 162 and the fluid spraying nozzle 161A. The fluid supplied from the fluid supply 162 may be sprayed onto the substrate W through the fluid supply pipe 161B and then through the fluid spraying nozzle 161A. In some embodiments, the developer may be provided to the substrate W through the fluid supplier 160, so that the developing process on the substrate W may be performed. In some cases, the fluid supply 162 may be disposed outside of the process chamber 100, where a portion of the fluid supply pipe 161B may be disposed outside of the process chamber. In some cases, the fluid supply 162 may be disposed inside of the process chamber 100.

In some embodiments, the fluid sprayer 161 includes a plurality of fluid sprayers. For example, each of the plurality of fluid sprayers may respectively spray a different type of fluid. For example, some fluid sprayers may respectively spray various chemicals, such as the developer for processing the substrate W. The other fluid sprayers may spray liquid for cleaning the substrate W.

Figure 3:
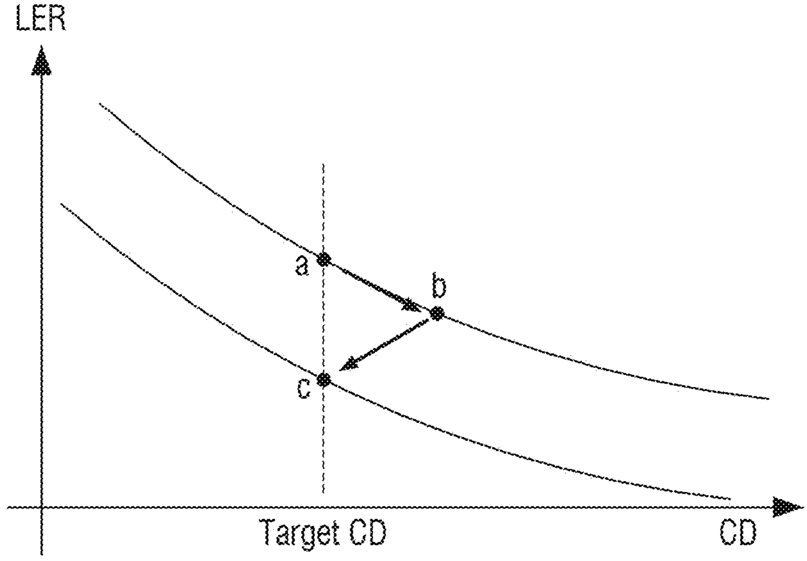
FIG. 3 is an example graph illustrating the manufacturing of a semiconductor device according to some embodiments of the present inventive concept.

FIG. 3 is an example graph illustrating the manufacturing of a semiconductor device according to some embodiments of the present inventive concept.

Referring to FIG. 3, the X-axis of the graph represents the critical dimension (CD) of the pattern formed on the substrate via the photolithography, and the Y-axis represents the line edge roughness (LER). To form a target pattern on the substrate W, the CD of the pattern should be set to a target CD and the line edge roughness should be reduced as much as possible. In the PEB process, to reduce the line edge roughness, high heat energy may be applied to the substrate W through the heater 140 (e.g., as shown in a→b). At this time, the line edge roughness may be lowered, while the critical dimension may be increased. As a result, the CD of the pattern formed on the substrate W may be larger than the target CD.

After the PEB process, the temperature of the developer may be lowered in the developing process. When performing the developing process using a low temperature developer, the line edge roughness of the pattern formed on the substrate W may be further reduced. At the same time, the CD of the pattern that has been increased via the PEB process may be reduced to the target CD (e.g., as shown in b→c). Accordingly, controlling the temperature of the heat energy supplied to the substrate W in the PEB process and the temperature of the developer supplied to the substrate W in the developing process may adjust the critical dimension and the line edge roughness of the pattern formed on the substrate W in the photolithography process to a targeted level.

Figure 4:
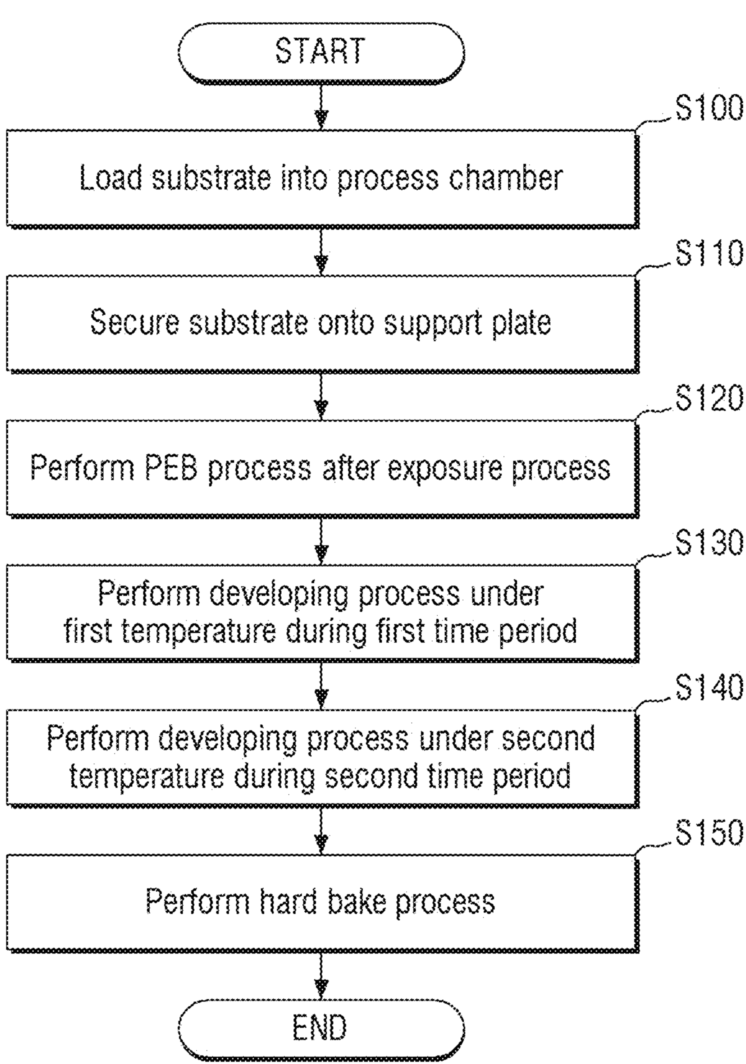
FIG. 4 is an example flowchart of a method for manufacturing a semiconductor device according to some embodiments of the present inventive concept.
Figure 5:
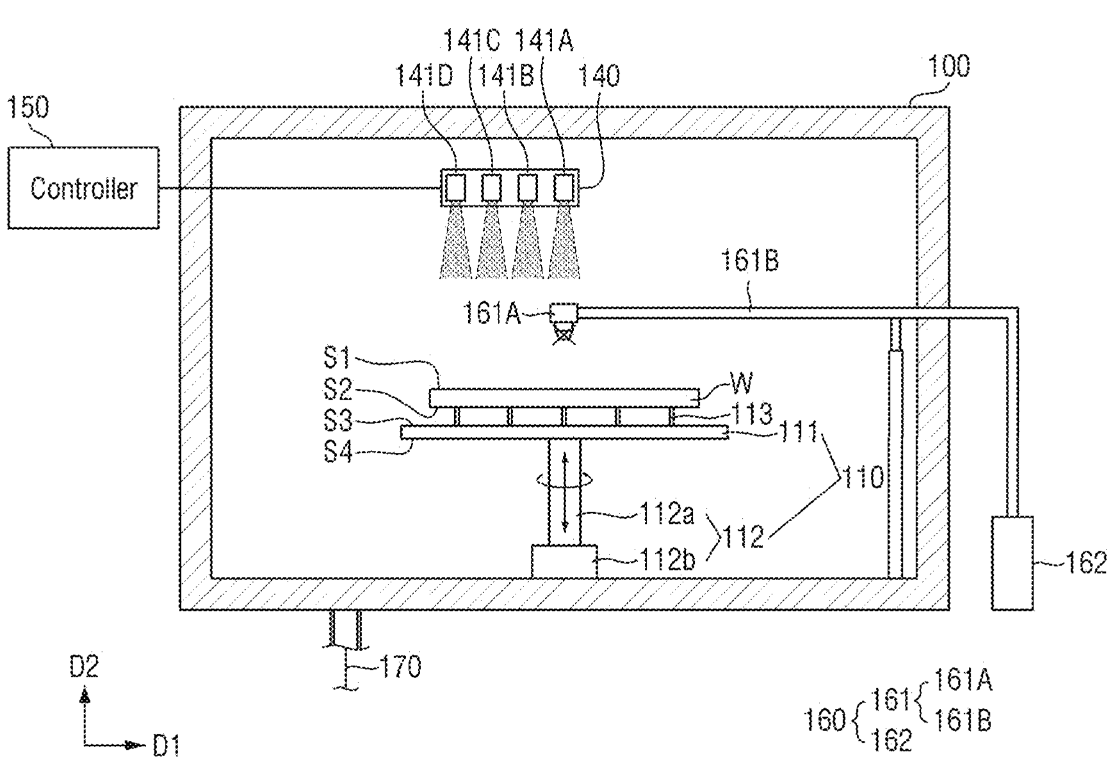
FIGS. 5, 6, and 7 are illustrative diagrams for performing the PEB (post-exposure bake) process according to some embodiments of the present inventive concept.
Figure 6:
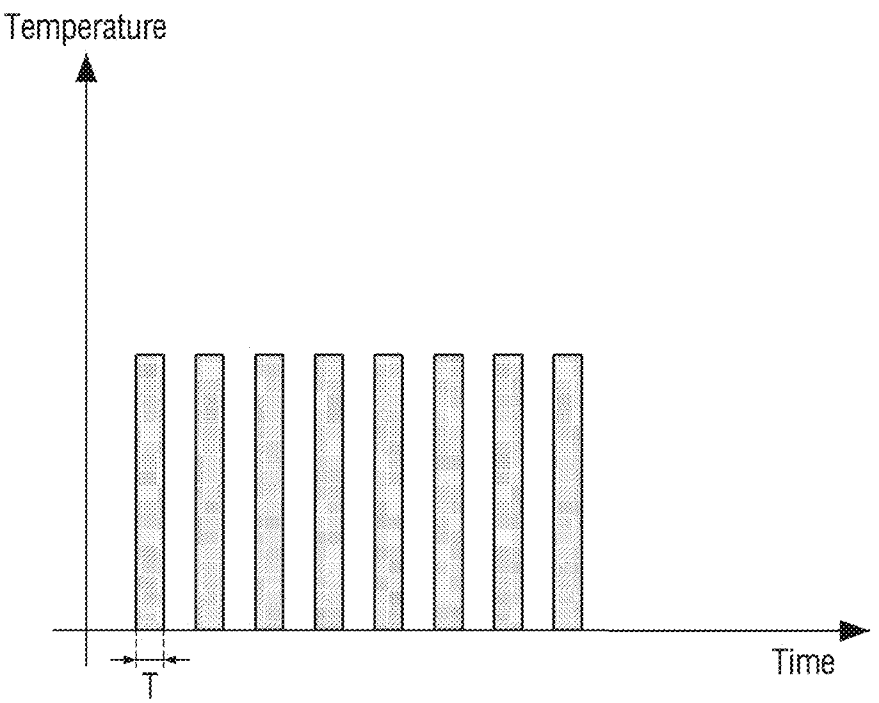
Figure 7:
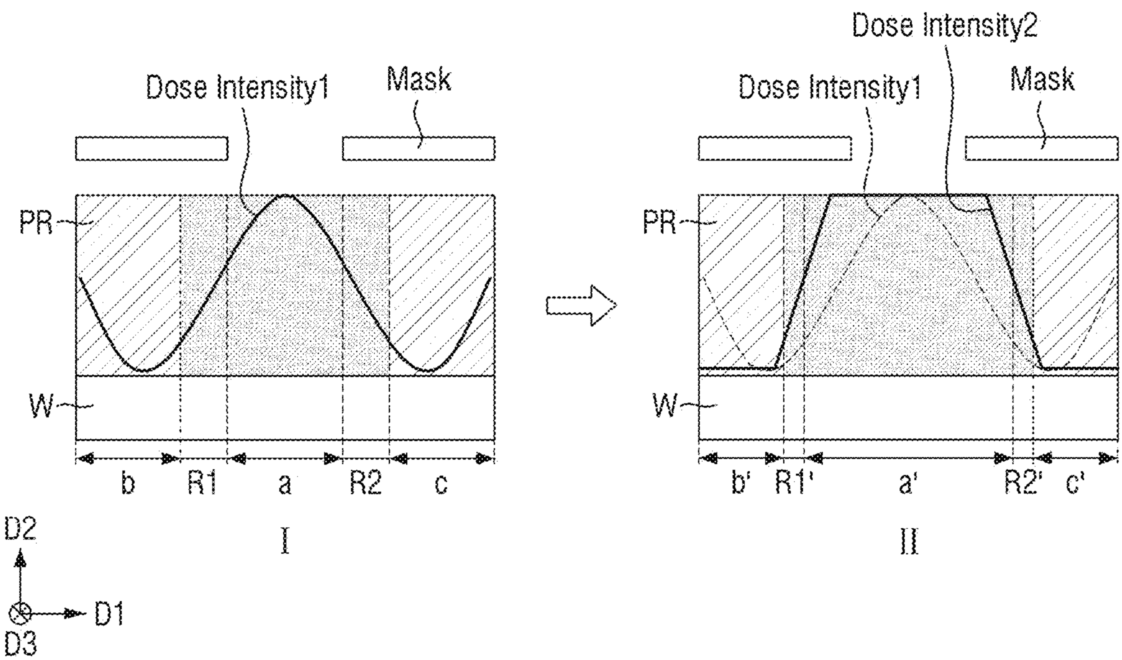
Figure 16:
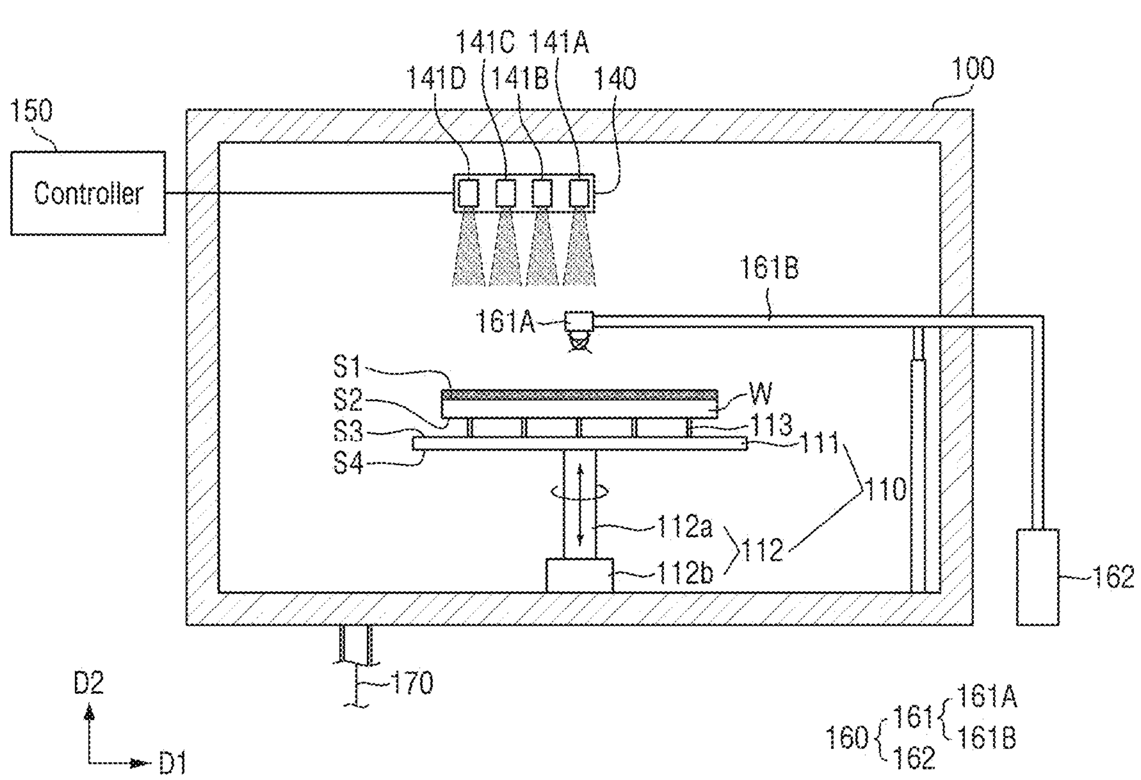
FIG. 16 is an illustrative diagram for performing a hard bake process according to some embodiments of the present inventive concept.

FIG. 4 is an example flowchart of a method for manufacturing a semiconductor device according to some embodiments of the present inventive concept. FIGS. 5 to 7 are illustrative diagrams for performing the PEB (post-exposure bake) process according to some embodiments of the present inventive concept. FIGS. 8 to 15 are illustrative diagrams for performing a developing process according to some embodiments of the present inventive concept. FIG. 16 is an illustrative diagram for performing a hard bake process according to some embodiments of the present inventive concept. Hereinafter, with reference to FIGS. 4 to 16, a method for manufacturing a semiconductor device according to some embodiments of the present inventive concept is described.

Referring to FIGS. 4 and 5, the substrate W may be loaded into the process chamber 100 at step S100 and the substrate W may be secured on the support plate 111 of the supporter 110 at step S110. For example, the substrate W may be introduced into the substrate processing apparatus 1000 using the transfer robot 130 as shown in FIG. 1. When the opening of the process chamber 100 is opened, the substrate W may be mounted on the support plate 111 of the supporter 110 using the transfer robot 130. In some cases, the support pin 113 may rise up along the second direction D2 to support and secure the substrate W.

Next, PEB process may be performed on the substrate W after an exposure process is performed on the substrate at step S120. For example, the PEB process may be performed using the heater 140. During the PEB process, the controller 150 may control the power of each of the irradiation modules 141A, 141B, 141C, and 141D included in the heater 140 and the intensity of the light pulse generated by each of the irradiation modules 141A, 141B, 141C, and 141D to adjust the temperature inside the process chamber 100 so that the substrate W is sufficiently heated. For example, during the PEB processing, the temperature inside the process chamber 100 may range from 100° C. to 300° C. due to the light-based heat energy supplied by the heater 140. In some cases, during the PEB process, the controller 150 may turn on the power of all irradiation modules 141A, 141B, 141C, and 141D to generate high-temperature light-based heat energy. However, the present disclosure is not necessarily limited thereto. The controller 150 may turn off the power of at least one of the irradiation modules 141A, 141B, 141C, and 141D to generate the high-temperature light-based heat energy or to reduce the temperature of the light-based heat energy. During the PEB process, to uniformly transfer the light-based heat energy to all regions of the first surface S1 of the substrate W, the rotator 112 may rotate the substrate W secured on the support plate 111 via the support pin 113.

FIG. 6 shows a graph of the temperature inside the process chamber 100 over time during the PEB process. As shown in FIG. 6, when the heat from the heater 140 is applied to the substrate W during the PEB process, discontinuous and impulsive light-based heat energy may be applied to the substrate W. For example, when the heater 140 includes the VCSEL array to generate the light pulse, the heat energy may be applied to the substrate W for a time interval T through the VCSEL array. When no light pulse is directed to the substrate W, the temperature inside the process chamber 100 may be reduced.

Referring to FIG. 7, each of I and II in FIG. 7 shows a schematic application of photoresist PR onto the substrate W and exposure of light thereto to transfer a mask pattern to the substrate W, respectively. For example, the substrate W may be disposed on a plane along the first direction D1 and the third direction D3. In some cases, the photoresistor PR may be applied onto the substrate W in the second direction D2.

A dose intensity represents distribution of an intensity of exposure energy delivered to photoresist PR. In FIG. 7, the intensity of the exposure energy may increase in the second direction D2. The intensity of exposure energy may decrease in the opposite direction to the second direction D2. For example, referring to I in FIG. 7, the intensity of the exposure energy may be largest in an area a, while the intensity of the exposure energy may be smallest in an area b and an area c.

For example, II in FIG. 7 shows an example where the discontinuous and impulsive heat energy as shown in FIG. 5 is applied to the substrate W through light pulses during the PEB process. I in FIG. 7 shows an example where the heat energy transferred to the substrate W is smaller than that of II during the PEB process.

First, referring to I of FIG. 7, the area a may be an area exposed to the exposure energy, and the areas b and c may be non-exposed areas that are not exposed to the exposure energy. A width of the area a measured in the first direction D1 may correspond to the critical dimension, and each of an area R1 between the area a and the area b, and an area R2 between the area a and the area c may be an area corresponding to line edge roughness. For example, the smaller the width of each of the area R1 or the area R2 measured in the first direction D1, the lower the line edge roughness of the pattern formed on the substrate W.

Next, referring to II of FIG. 7, an area a' may be an area exposed to the exposure energy, and areas b' and c' may be non-exposed areas that are not exposed to the exposure energy. A width of the area a' measured in the first direction D1 may correspond to the critical dimension, and each of an area R1' between the area a' and the area b', and an area R2' between the area a' and the area c' may be an area corresponding to the line edge roughness. Compared to I of FIG. 7, the line edge roughness in II is decreased. For example, A dose intensity2 in II may be greater than a dose intensity1 in I, and accordingly, the critical dimension may be larger in II than the critical dimension in I, and the line edge roughness may be lower in II than that in I.

Accordingly, when the impulsive light-based heat energy is applied to the substrate W via the light pulse, higher heat energy may be applied to the substrate W than when continuous heat energy is applied to the substrate W, for example by using a heater. Furthermore, when the substrate W is heated for a long time using high thermal energy during the PEB process, the line edge roughness of the pattern formed on the substrate W may be further reduced as shown in the graph in FIG. 3. As a result, the PEB process may be performed on the substrate W on which the exposure process is completed to induce a crosslinking reaction of the exposed photoresist PR.

Next, referring to FIGS. 4 and 8-10, the developing process may be performed on the substrate W on which the PEB process has been completed. For example, at step S130, developing process is performed under a first temperature during a first time period. At step S140, the developing process is performed under a second temperature during a second time period. In some case, to reduce the critical dimension that has become larger than the target CD through the PEB process back to the target CD as shown in FIG. 3, the developing process may be performed using the developer at a low temperature.

Figure 8:
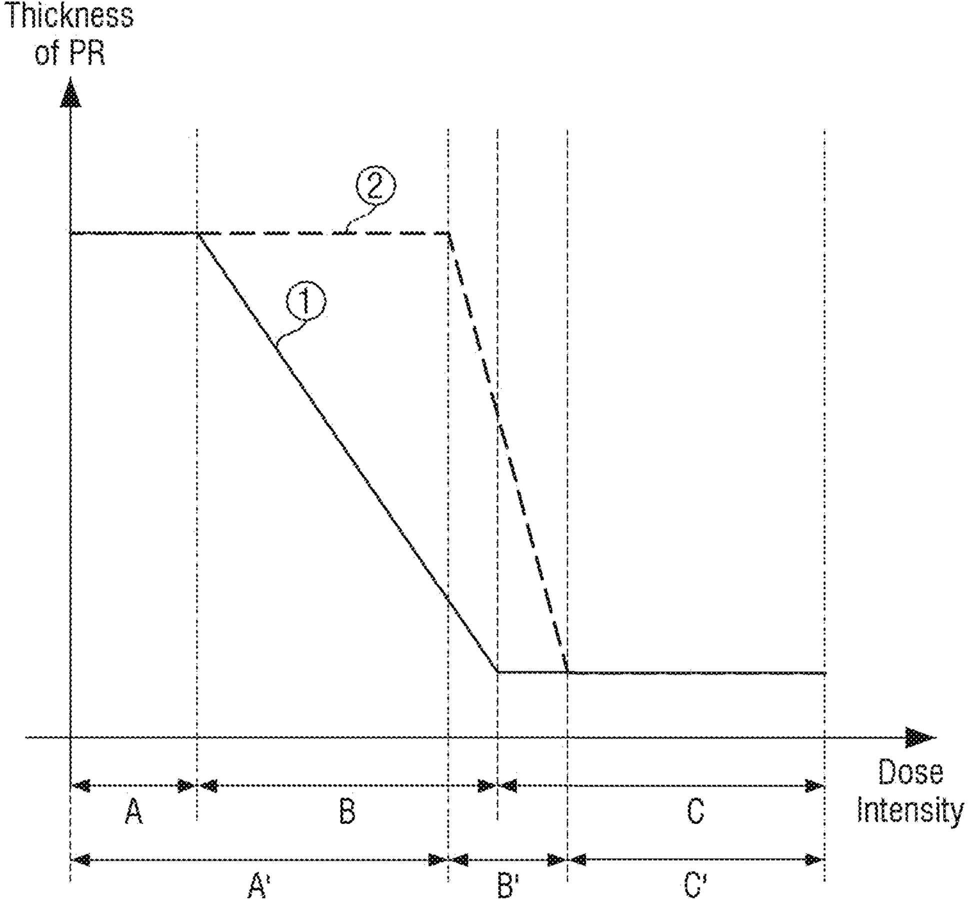
FIGS. 8, 9, 10, 11, 12, 13, 14, and 15 are illustrative diagrams for performing a developing process according to some embodiments of the present inventive concept.

For example, referring to FIG. 8, an X-axis of the graph shown in FIG. 8 represents a dose intensity (i.e., exposure energy), and a Y-axis represents a thickness of the photoresist PR. ① in FIG. 8 represents an example where the developer temperature is high, and ② represents an example where the developer temperature is low.

First, referring to ① depicted in FIG. 8, a section A corresponds to an area where the photoresist PR is insoluble, a section C corresponds to an area where the photoresist PR is soluble, and a section B, between the section A and the section C, corresponds to an ambiguous area. Likewise, referring to ②, a section A' corresponds to an area where the photoresist PR is insoluble, a section C' corresponds to an area where the photoresist PR is soluble, and a section B', between the section A' and the section C', corresponds to an ambiguous area.

The ambiguous area refers to an area corresponding to line edge roughness. As an absolute value of a slope of the ambiguous area becomes larger, the line edge roughness becomes smaller. For example, as an absolute value of a change in a photoresist thickness relative to a change in the dose intensity in the area B or the area B' becomes larger, the line edge roughness is lower. Conversely, as an absolute value of a slope of the ambiguous area, for example, an absolute value of a change in a photoresist thickness relative to a change in the dose intensity in the area B or the area B' is smaller, the line edge roughness is higher.

As shown in FIG. 8, in the example of ② where the developer's temperature is relatively low, the absolute value of the slope of the ambiguous area is larger than the absolute value of the slope of the ambiguous area in the example of ①, where the developer's temperature is relatively high in example ①. For example, the lower the developer temperature, the smaller the line edge roughness.

In some embodiments, the developing process may include two or more time periods. For example, in a first time period, the developing process may be performed at a first temperature under an operation by the heater 140. Furthermore, in a second time period after the first time period, the developing process may be performed at a second temperature under an operation by the heater 140, where the second temperature is lower than the first temperature.

Figure 9:
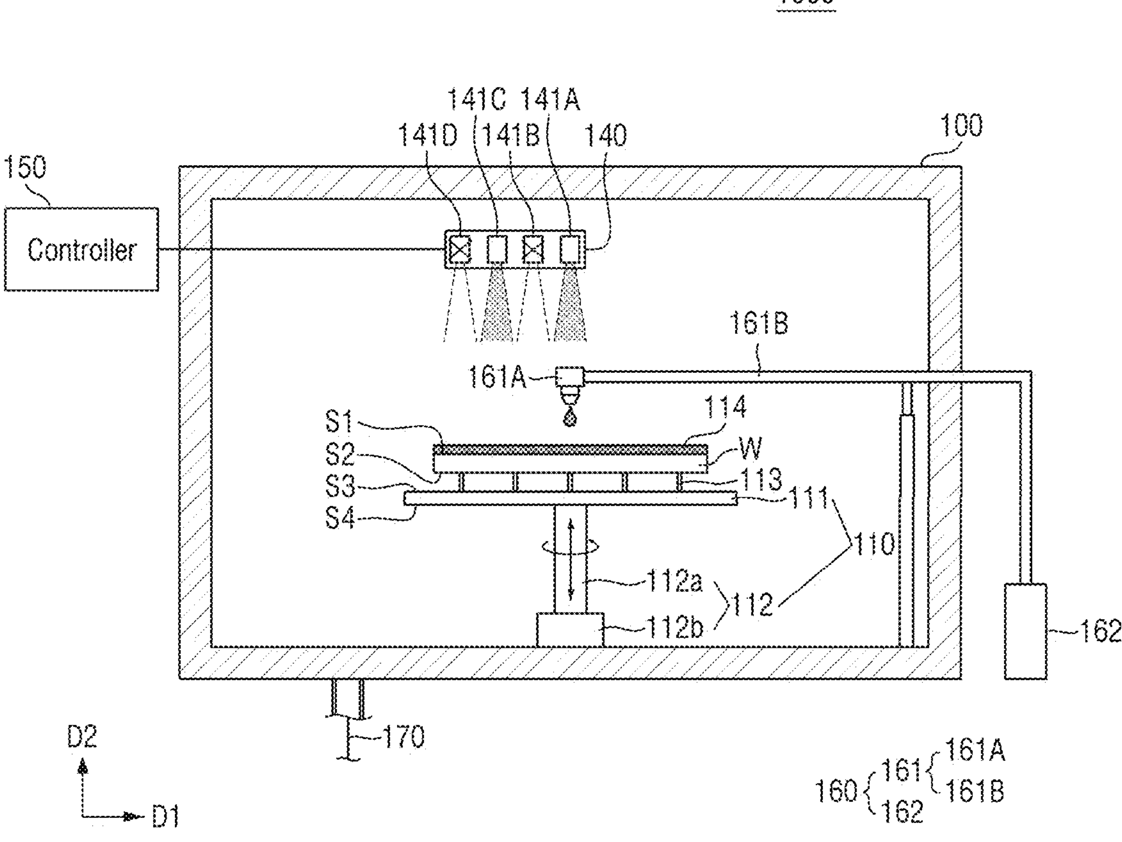
Figure 10:
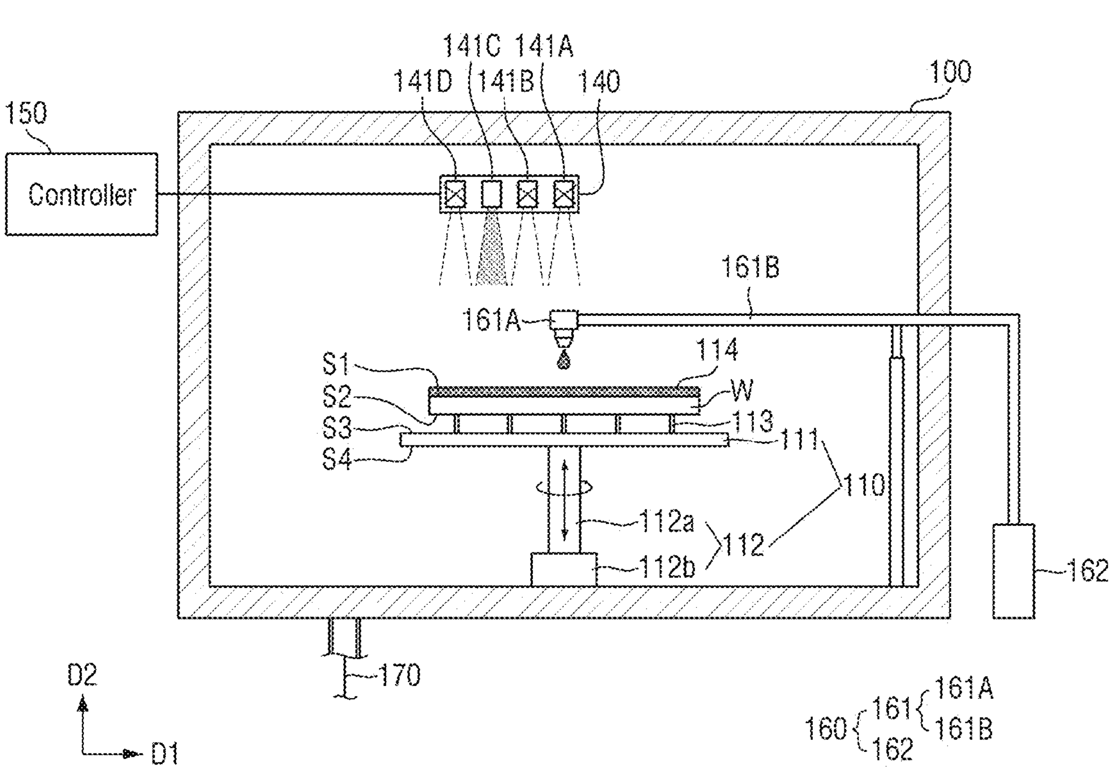

For example, FIG. 9 may represent the first time period of the developing process, and FIG. 10 may represent the second time period of the developing process. Referring to FIG. 9, during the first time period, the controller 150 individually controls the power of each of the irradiation modules 141A, 141B, 141C, and 141D included in the heater 140 such that the power of some of the irradiation modules 141A, 141B, 141C, and 141D may be turned on, and the power of the remaining irradiation modules may be turned off. However, an embodiment is not necessarily limited thereto, and the controller 150 may turn on the power of all irradiation modules 141A, 141B, 141C, and 141D while controlling the power of all irradiation modules 141A, 141B, 141C, and 141D such that the intensity of the light pulse generated by each of the irradiation modules 141A, 141B, 141C, and 141D may be lowered. In some embodiments, the irradiation modules 141A and 141C may be turned on, and the the irradiation modules 141B and 141D may be turned off.

As a result, the controller 150 may individually control the power of each of the irradiation modules 141A, 141B, 141C, and 141D included in the heater 140 such that the intensity of the light pulse generated by the heater 140 in the development process is smaller than the intensity of the light pulse generated by the heater 140 in the PEB process.

During the developing process, to evenly apply the developer via fluid supplier 160 to all regions of the first surface S1 of the substrate W, the rotator 112 of the supporter 110 may rotate the substrate W mounted on the support plate 111 via the support pin 113. Accordingly, a developer-applied layer 114 may be evenly formed on the first surface S1 of the substrate W.

Referring to FIG. 10, during the second time period after the first time period, the controller 150 may individually control the power of each of the irradiation modules 141A, 141B, 141C, and 141D included in the heater 140 such that the intensity of the light pulse generated by the heater 140 during the second time period is smaller than the intensity of the light pulse generated by the heater 140 during the first time period. For example, as shown in FIGS. 9 and 10, when, during the first time period, the controller 150 turns on the power of the irradiation modules 141A and 141C and turns off the power of the irradiation modules 141B and 141D, the controller 150 may turn off the power of the remaining irradiation modules except for the irradiation module 141C. In addition, the controller 150 may slightly increase the power of the irradiation module 141C during the second time period. However, an embodiment is not necessarily limited thereto. According to an embodiment, the irradiation modules that are turned on or off in each of the first time period and the second time period may be different from those as shown in FIGS. 9 and 10. For example, in some cases, three of the irradiation modules of the heater 140 may be turned on during the first time period, and two of the irradiation modules of the heater 140 may be turned on during the second time period.

Accordingly, when performing the developing process, the temperature of the developer applied to the substrate W may be lowered by lowering the intensity of the light pulse generated by the heater 140 over time controlled by the controller 150. For example, the temperature of the developer during the first time period is 35° C., the temperature of the developer during the second time period may be about 25° C. The temperature difference of the developer during the first time period and the second time period may be about 10° C. lower. Accordingly, lowering the temperature of the developer may reduce the line edge roughness and, at the same time, may reduce the critical dimension increased during the PEB process to the target CD, as shown in FIGS. 3 and 8.

Figure 11:
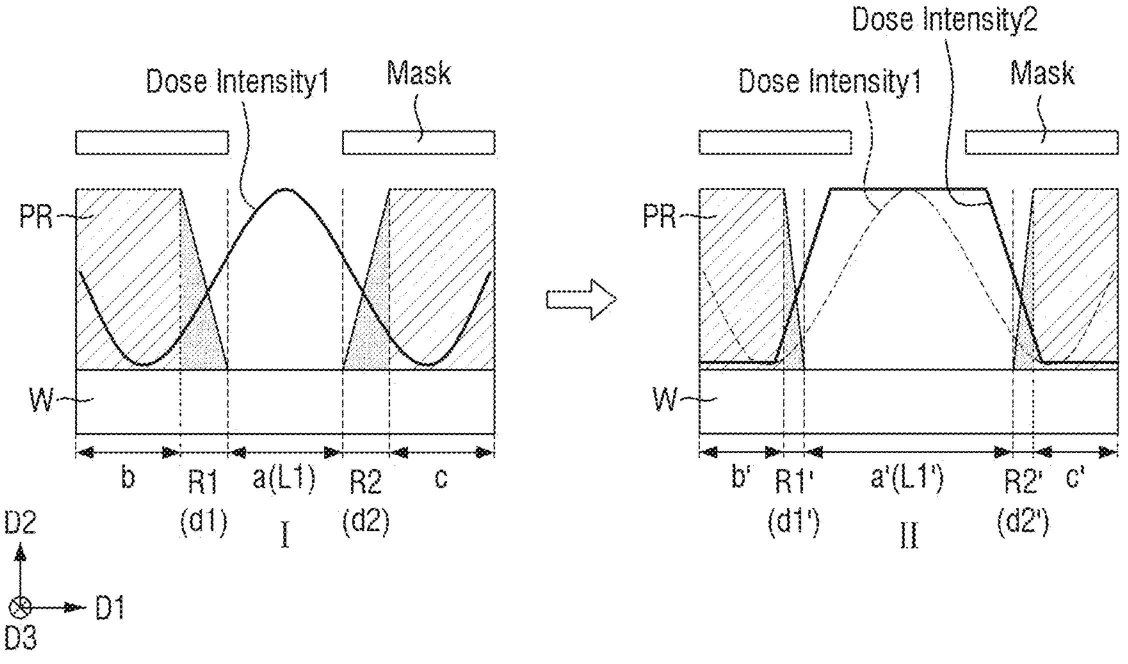

Next, FIG. 11 respectively shows each of diagrams showing that each of I and II of FIG. 7 is subjected to the PEB process and the developing process such that a pattern is formed on the substrate W. Referring to II in FIG. 11, with reference to FIG. 5, due to the high thermal energy applied to the substrate W during the PEB process, a length d1' of the area R1' measured in the first direction D1 and a length d2' of the area R2' measured in the first direction D1 may be respectively smaller than a length d1 of the area R1 measured in the first direction D1 and a length d2 of the area R2 measured in the first direction D1 in I. For example, heat energy applied to substrate W in I is lower than the heat energy applied to substrate W in II. Accordingly, the line edge roughness in II may be lower than the line edge roughness in I.

In the example of I in FIG. 11, the critical dimension corresponding to the length measured in the first direction D1 of the area a where the photoresist PR is dissolved due to the exposure energy is represented as L1. In some cases, L1 may correspond to the target CD. As a result, when the PEB process is performed using high thermal energy (II), the critical dimension of a finally-formed pattern (i.e., the length of the area a' measured in the first direction D1) is L1', which may be larger than L1 as the target CD (L1'>L1).

Figure 12:
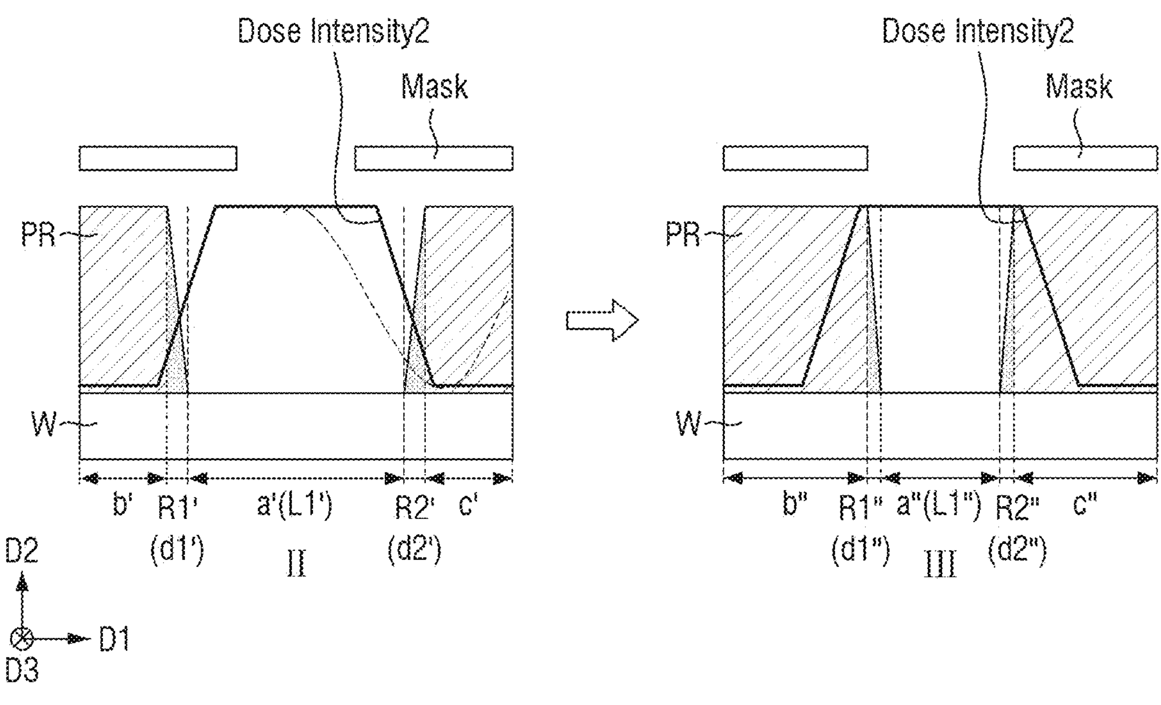

Next, referring to FIG. 12, III in FIG. 12 shows that the photoresist PR is subjected to the developing process after the PEB process during which the temperature of the developer is relatively lowered, as shown in FIGS. 9 and 10. Referring to III in FIG. 12, the critical dimension of the finally-formed pattern (i.e., a length of an area a" measured in the first direction D1) is represented as L1". In some cases, length L" may be smaller than L1', which is the critical dimension in II in which the PR is not subjected to the developing process using a low-temperature developer (L1"<L1').

Furthermore, a length d1" measured in the first direction D1 of an area R1" and a length d2" of an area R2" measured in the first direction of D1 in the example of III in which the developing process is performed using the low-temperature developer may be respectively smaller than the length d1' measured in the first direction D1 of the area R1' and the length d2' measured in the first direction D1 of the area R2', respectively, in the example of II where the developing process using the low-temperature developer is not performed. For example, high thermal energy is applied to the substrate W in II, whereas low-temperature developer is applied to the substrate W in III. Accordingly, in the example of III, the line edge roughness may be lower than the line edge roughness in the example of II. Thus, when the developing process is performed using the developer with a lower temperature, both the line edge roughness and the critical dimension may be improved (e.g., the line edge roughness is reduced and the critical dimension is reduced).

Figure 13:
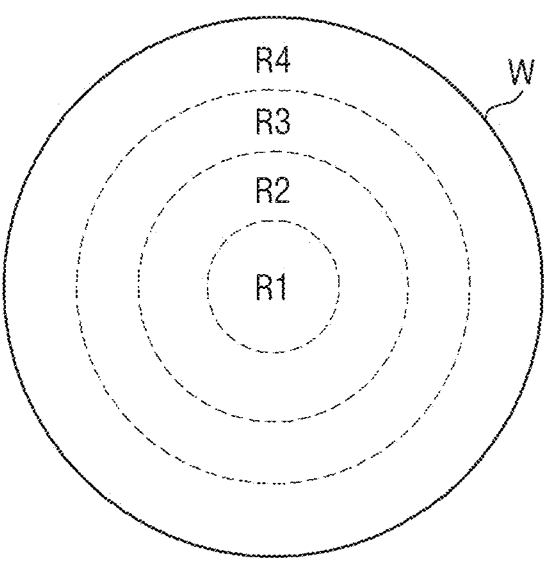

Referring to FIG. 13, the substrate W may be provided. For example, FIG. 13 shows a top view of the first surface S1 of the substrate W in FIG. 2. In FIG. 13, the substrate W is shown in a form of a disk. However, an embodiment is not necessarily limited thereto. For example, the substrate W may be provided in a form of a polygonal plate including a plurality of distinct areas. In the following description, the example of a substrate W in the form of the disk is described.

The substrate W may include a first area R1, a second area R2, a third area R3, and a fourth area R4. In some cases, the first area R1, the second area R2, the third area R3, and the fourth area R4 are each in a form of a ring. For example, a center of the first area R1 may be aligned at a center of the substrate W, and the second to fourth areas R2, R3, and R4 may be outer areas (or edge areas) of the substrate W sequentially surrounding the first area R1 in this order. For example, the fourth area R4 encircles the third area R3, the third area R3 encircles the second area R2, and the second area R2 encircles the first area R1.

As shown in FIG. 13 and with reference to FIG. 2, the first to fourth areas R1, R2, R3, and R4 of the substrate W may correspond to the first to fourth irradiation modules 141A, 141B, 141C, and 141D, respectively. For example, when the substrate W is secured on the support plate 111 of the supporter 110, the first irradiation module 141A may be disposed on top of the first area R1 of the substrate W, where the first irradiation module 141A is spaced apart from the first area R1 of the substrate W in the second direction D2. The second irradiation module 141B may be disposed on top of the second area R2 of the substrate W, where the second irradiation module 141B is spaced apart from the second area R2 of the substrate W in the second direction D2. Likewise, the third irradiation module 141C and the fourth irradiation module 141D may be respectively disposed on top of the third area R3 and the fourth area R4 of the substrate W, where the third irradiation module 141C and the fourth irradiation module 141D are respectively spaced apart from the third area R3 and the fourth area R4 of the substrate W in the second direction D2

Accordingly, the light pulse generated by the first irradiation module 141A may be directed to the first area R1 of the substrate W to heat the substrate W. The light pulse generated by the second irradiation module 141B may be directed to the second area R2 of the substrate W to heat the substrate W. Likewise, the light pulse generated by the third irradiation module 141C may be directed to the third area R3 of the substrate W to heat the substrate W. The light pulse generated by the fourth irradiation module 141D may be directed to the fourth area R4 of the substrate W to heat the substrate W.

FIG. 13 shows that the first surface S1 of the substrate W is divided into four areas. However, an embodiment is not necessarily limited thereto. The area of the first surface S1 of the substrate W may be divided into two or more areas based on the number of irradiation modules included in the heater 140 disposed on top of the substrate W. For example, when two irradiation modules are provided on top of the substrate W, the first surface S1 of the substrate W may be divided into two areas. For example, the first surface S1 of the substrate W may be divided into a first area R1 and a second area R2, where the second area R2 encircles the first area R1.

Accordingly, the heater 140 that applies the heat to the substrate W inside the process chamber 100 in during the PEB process, the developing process, and the hard bake process are performed at once may be composed of the plurality of irradiation modules that respectively generate the light pulses. Thus, during the developing process, the profile of the pattern formed on the substrate W may be selectively controlled by selectively heating the local area of the substrate W on which the developer has been applied.

Figure 14:
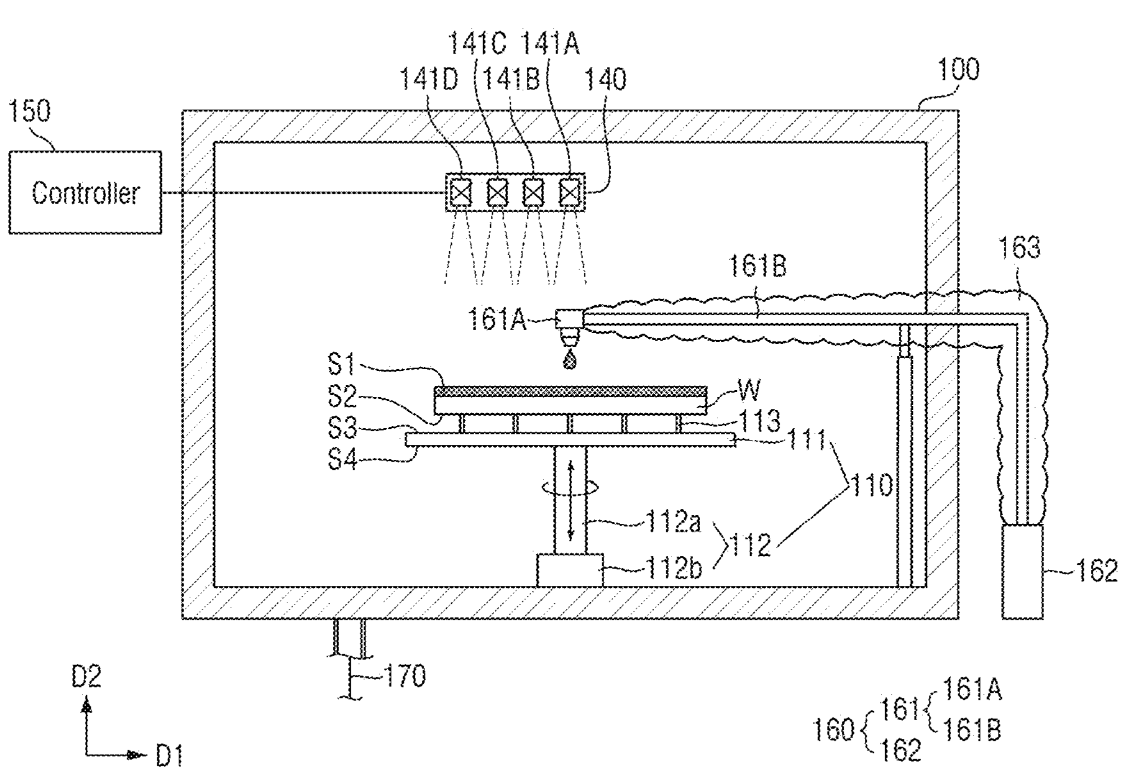
Figure 15:
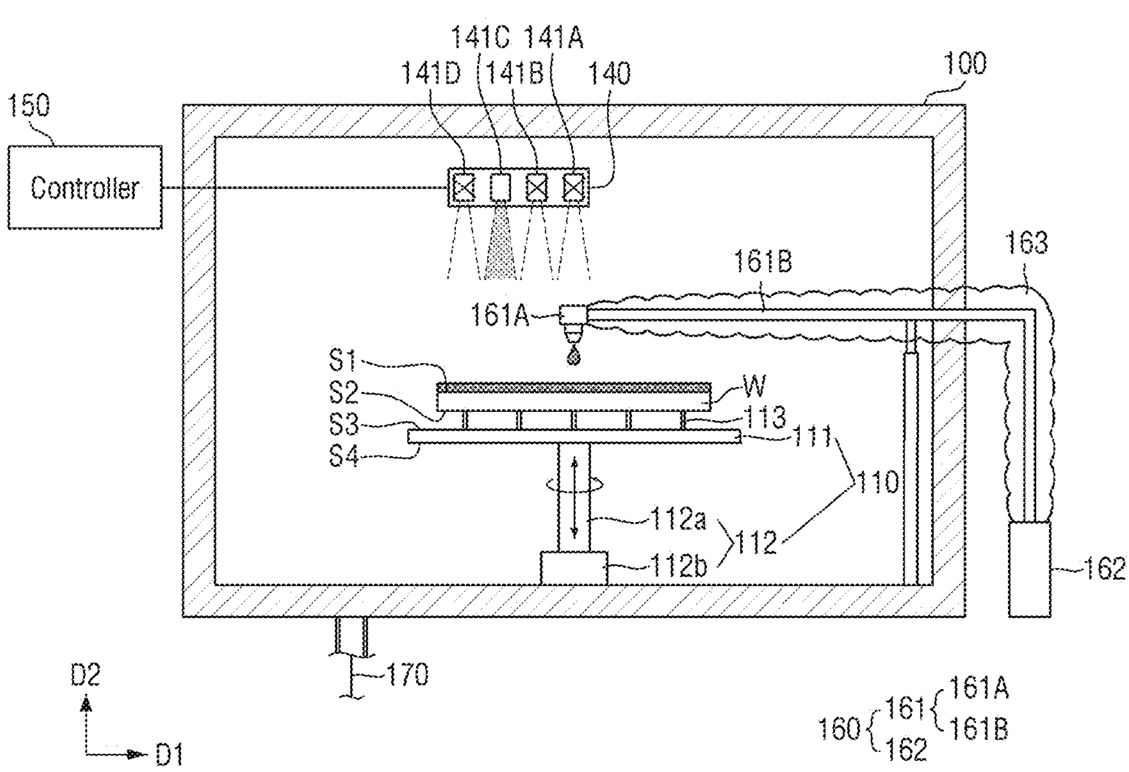

Referring to FIG. 14, in some embodiments, at least a portion of the fluid supply pipe 161B may be covered (or surrounded) with a cooling jacket 163. The cooling jacket 163 may reduce a temperature of the developer to be supplied from the fluid supply 162 to the fluid spraying nozzle 161A. Accordingly, during the developing process, the critical dimension of the pattern that has become larger than the target CD as a result from the previous PEB process may be reduced to the target CD. Additionally, the line edge roughness may be reduced. Accordingly, a target pattern may be formed on the substrate W through the photolithography process.

During the developing process, when at least a portion of the fluid supply pipe 161B is covered with the cooling jacket 163 to lower the temperature of the developer, the controller 150 may turn off the power of the irradiation modules 141A, 141B, 141C, and 141D of the heater 140. Accordingly, during the developing process, the heat energy by the light pulse generated by the heater 140 might not be provided to the substrate W. Thus, the temperature of the developer supplied to the substrate W may be reduced.

However, according to an embodiment, when at least a part of the fluid supply pipe 161B is covered (or surrounded) with the cooling jacket 163 such that the developing process is performed with the developer at a lower temperature, the controller 150 may individually control the power of each of the irradiation modules 141A, 141B, 141C, and 141D of the heater 140 to slightly turn on the power of some irradiation modules thereof. For example, referring to FIG. 15, during the developing process, the controller 150 may turn on the power of the irradiation module 141C, such that the intensity of the light pulse is slightly increased, to control the irradiation module 141C to generate the light pulse. Accordingly, when the developer is applied to the first surface S1 of the substrate W, the third area R3 (e.g., as shown in FIG.

13) corresponding to the irradiation module 141C among the areas of the first surface S1 of the substrate W may be selectively heated. As a result, the profile of the pattern formed on the substrate W may be selectively controlled.

Next, referring to FIGS. 4 and 16, at step S150, hard bake process is performed on the substrate W. For example, the hard bake process may be performed on the substrate W after the developing process. During the hard bake process, the controller 150 may control the power of each of the irradiation modules 141A, 141B, 141C, and 141D included in the heater 140. In addition, the controller 150 may control the intensity of the light pulse generated by each of the irradiation modules 141A, 141B, 141C, and 141D of the heater 140 to adjust the temperature inside the process chamber 100 so that the substrate W is sufficiently heated. For example, during the hard bake process, the temperature inside the process chamber 100 may range from 100° C. to 300° C. due to the light-based heat energy supplied from the heater 140. In some cases, during the hard bake process, the controller 150 may generate the high-temperature light-based heat energy by turning on the power of the irradiation modules 141A, 141B, 141C, and 141D. However, the present disclosure is not necessarily limited thereto. The controller 150 may turn off the power of one or more of the irradiation modules 141A, 141B, 141C, and 141D.

During the hard bake process, to evenly transfer the light-based heat energy to all areas of the first surface S1 of the substrate W, the rotator 112 may rotate the substrate W secured on the support plate 111 of the supporter 110 via the support pin 113 of the supporter 110. Through the hard bake process, the substrate W having the pattern with the target CD and the low line edge roughness, formed from the PEB process and the developing process, may be heated to remove moisture remained on the substrate W after the developing process.

Although embodiments of the present disclosure have been described with reference to the accompanying drawings, the present disclosure is not necessarily limited to the above embodiments, but may be implemented in various different forms. A person skilled in the art may appreciate that the present disclosure may be practiced in other concrete forms without changing the technical spirit or essential characteristics of the present disclosure. Therefore, it should be appreciated that the embodiments as described above is not restrictive but illustrative in all respects.

What is claimed is:

1. A substrate processing apparatus comprising:
- a process chamber having a space in which a substrate is disposed, wherein the substrate includes a first surface and a second surface opposite from the first surface;
- a supporter disposed in the process chamber and configured to support and rotate the substrate;
- a heater disposed in the process chamber and configured to heat the first surface of the substrate, wherein the heater includes one or more irradiation modules for generating light pulses and directing the light pulses to the first surface of the substrate;
- a controller configured to control an intensity of a light pulse generated by each of the one or more irradiation modules of the heater; and
- a fluid supplier configured to supply fluid to the first surface of the substrate,
- wherein a period during which the fluid supplier supplies the fluid to the first surface of the substrate includes a first time period and a second time period after the first time period, and
- wherein the controller is configured to control the intensity of the light pulse generated by each of the one or more irradiation modules such that:
- the fluid having a first temperature is supplied to the first surface of the substrate during the first time period; and
- the fluid having a second temperature lower than the first temperature is supplied to the first surface of the substrate during the second time period.

2. The substrate processing apparatus of claim 1, wherein the heater includes:
- a first irradiation module configured to generate a first light pulse and direct the first light pulse to a first region of the first surface of the substrate; and
- a second irradiation module configured to generate a second light pulse and direct the second light pulse to a second region of the first surface of the substrate,
- wherein a sum of an intensity of the first light pulse and an intensity of the second light pulse during the second time period is less than a sum of an intensity of the first light pulse and an intensity of the second light pulse during the first time period.

3. The substrate processing apparatus of claim 1, wherein the fluid supplier includes:
- a fluid spraying nozzle for spraying the fluid onto the first surface of the substrate in the process chamber;
- a fluid supply for supplying the fluid to the fluid spraying nozzle; and
- a fluid supply pipe connecting the fluid spraying nozzle and the fluid supply.

4. The substrate processing apparatus of claim 3, wherein the fluid supplier further includes a cooling jacket covering at least a portion of the fluid supply pipe.

5. The substrate processing apparatus of claim 1, wherein the heater is configured to:
- before the first time period, direct a light pulse to the first surface of the substrate inside the process chamber to perform a first heat treatment on the substrate; and
- after the second time period, direct a light pulse to the first surface of the substrate inside process chamber to perform a second heat treatment on the substrate.

6. The substrate processing apparatus of claim 5, wherein the supporter includes:
- a support plate having a third surface disposed under the second surface of the substrate and a fourth surface opposite to the third surface; and
- a rotator connected to the fourth surface of the support plate and configured to rotate the support plate,
- wherein during each of the first heat treatment and the second heat treatment, and during each of the first time period and the second time period, the rotator is configured to rotate the support plate on which the substrate is disposed on.

7. The substrate processing apparatus of claim 5, wherein when performing the first heat treatment, the controller is configured to turn on powers of the one or more irradiation modules, and
- wherein during each of the first time period and the second time period, the controller is configured to turn off the powers of at least one of the one or more irradiation modules.

8. The substrate processing apparatus of claim 1, wherein the controller is configured to control the intensity of the light pulse generated by each of the one or more irradiation modules such that:
- heat is applied to the substrate at a third temperature during the first time period;

heat is applied to the substrate at a fourth temperature lower than the third temperature during the second time period;

heat is applied to the substrate at a fifth temperature higher than the third temperature during a third time period before the first time period; and heat is applied to the substrate at a sixth temperature higher than the third temperature during a fourth time period after the second time period.

9. The substrate processing apparatus of claim 1, wherein the fluid includes a developer.

10. A substrate processing apparatus comprising:

a substrate having a first surface and a second surface opposite from the first surface, wherein the first surface includes a first area and a second area surrounding the first area;

a process chamber having a space in which the substrate is disposed;

a support plate having a third surface disposed under the second surface of the substrate, and a fourth surface opposite from the third surface;

a rotator connected to the fourth surface of the support plate and configured to rotate the support plate;

a first irradiation module disposed in the process chamber and configured to generate a first light pulse and direct the first light pulse to the first area of the substrate;

a second irradiation module disposed in the process chamber and configured to generate a second light pulse and irradiate the second light pulse to the second area of the substrate;

a controller configured to control an intensity of each of the first light pulse and the second light pulse generated by each of the first irradiation module and the second irradiation module, respectively; and a fluid supplier configured to supply fluid to the first surface of the substrate disposed on the support plate, wherein a period during which the fluid supplier supplies the fluid to the first surface of the substrate includes a first time period and a second time period after the first time period, wherein a sum of an intensity of the first light pulse and an intensity of the second light pulse during the first time period is greater than a sum of an intensity of the first light pulse and an intensity of the second light pulse during the second time period, and wherein the fluid includes a developer.

11. The substrate processing apparatus of claim 10, wherein a first temperature of the fluid during the first time period is higher than a second temperature of the fluid during the second time period.

12. The substrate processing apparatus of claim 10, wherein the controller is configured to turn on a power of the first irradiation module and a power of the second irradiation module during the first time period.

13. The substrate processing apparatus of claim 12, wherein the controller is configured to turn off the power of the first irradiation module during the second time period.

14. The substrate processing apparatus of claim 12, wherein the controller is configured to turn off the power of the second irradiation module during the second time period.

15. A substrate processing apparatus comprising:

a process chamber having a space in which a substrate is disposed;

a supporter configured to support and rotate the substrate;

a heater disposed on top of the substrate and spaced apart from the substrate, wherein the heater is configured to direct a light pulse to the substrate to perform a first treatment and a second treatment on the substrate, and wherein the second treatment is different from the first treatment;

a controller configured to control an intensity of the light pulse generated by the heater; and a fluid supplier configured to supply fluid to the substrate to perform a third treatment on the substrate, wherein the third treatment is different from the first treatment and the second treatment, wherein the substrate processing apparatus is configured to:

perform the first treatment using the heater during a first time period inside the process chamber;

perform the third treatment using the fluid supplier during a second time period after the first time period and a third time period after the second time period inside the process chamber; and perform the second treatment using the heater during a fourth time period after the third time period inside the process chamber, wherein the controller is configured to control the intensity of the light pulse generated by the heater to:

apply heat to the substrate at a first temperature during the first time period;

apply heat to the substrate at a second temperature lower than a first temperature during the second time period;

apply heat to the substrate at a third temperature lower than the second temperature during the third time period; and apply heat to the substrate at a fourth temperature higher than the second temperature during the fourth time period.

16. The substrate processing apparatus of claim 15, wherein the substrate includes a first surface disposed on the supporter and a second surface opposite to the first surface, wherein the heater includes:

a first irradiation module configured to generate a first light pulse and direct the first light pulse to the second surface of the substrate; and a second irradiation module configured to generate a second light pulse and direct the second light pulse to the second surface of the substrate, wherein the controller is configured to individually control each of an intensity of the first light pulse and an intensity of the second light pulse.

17. The substrate processing apparatus of claim 16, wherein the second surface of the substrate includes a first area and a second area surrounding the first area, wherein the first irradiation module is disposed on top of the first area to direct the first light pulse to the first area, wherein the second irradiation module is disposed on top of the second area to direct the second light pulse to the second area.

18. The substrate processing apparatus of claim 17, wherein the controller is configured to turn on a power of the first irradiation module and a power of the second irradiation module during each of the first time period and the fourth time period.

19. The substrate processing apparatus of claim 17, wherein the controller is configured to turn off the power of at least one of the first irradiation module or the second irradiation module during each of the second time period and the third time period.

20. The substrate processing apparatus of claim 15, wherein the fluid includes a developer.

* * * * *